(12) United States Patent
Lee et al.

(10) Patent No.: US 12,144,186 B2
(45) Date of Patent: Nov. 12, 2024

(54) VARIABLE-RESISTANCE MEMORY DEVICE

(71) Applicant: SAMSUNG ELECTRONICS CO., LTD., Suwon-si (KR)

(72) Inventors: Jaehun Lee, Suwon-si (KR); Youngcheon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 675 days.

(21) Appl. No.: 17/345,776

(22) Filed: Jun. 11, 2021

(65) Prior Publication Data

US 2022/0085106 A1 Mar. 17, 2022

(30) Foreign Application Priority Data

Sep. 15, 2020 (KR) .................. 10-2020-0118559

(51) Int. Cl.
| | | |
|---|---|---|
| *H01L 45/00* | (2006.01) | |
| *H10B 63/00* | (2023.01) | |
| *H10N 70/00* | (2023.01) | |
| *H10N 70/20* | (2023.01) | |

(52) U.S. Cl.
CPC .......... *H10B 63/30* (2023.02); *H10N 70/011* (2023.02); *H10N 70/24* (2023.02); *H10N 70/8265* (2023.02); *H10N 70/841* (2023.02); *H10N 70/8833* (2023.02)

(58) Field of Classification Search
CPC ............. H10N 70/8265; H10N 70/841; H10N 70/8833
See application file for complete search history.

(56) References Cited

U.S. PATENT DOCUMENTS

| | | | |
|---|---|---|---|
| 9,012,880 B2 | 4/2015 | Jang et al. | |
| 9,203,020 B2 * | 12/2015 | Jang ..................... | H10N 70/841 |
| 9,780,302 B2 | 10/2017 | Chen et al. | |
| 10,269,868 B1 | 4/2019 | Yang et al. | |
| 10,490,744 B2 | 11/2019 | Lee et al. | |
| 2006/0223268 A1 | 10/2006 | Moriya et al. | |

(Continued)

FOREIGN PATENT DOCUMENTS

| | | |
|---|---|---|
| JP | 2006-278864 | 10/2006 |
| JP | 2011-91156 | 5/2011 |

(Continued)

OTHER PUBLICATIONS

Office Action dated Sep. 30, 2024 in corresponding KR Appln. No. 10-2020-0118559.

*Primary Examiner* — Mark V Prenty
(74) *Attorney, Agent, or Firm* — F. Chau & Associates, LLC

(57) ABSTRACT

A variable-resistance memory device includes a substrate, an insulating layer disposed on the substrate and having a contact hole, a contact structure filling a lower region of the contact hole, a first electrode layer having a first portion disposed on the contact structure and a second portion extending to a side wall of an upper region of the contact hole, a variable-resistance layer covering the first electrode layer in the upper region of the contact hole, a sidewall spacer disposed between the second portion of the first electrode layer and the variable-resistance layer in the upper region of the contact hole, and a second electrode layer disposed on the variable-resistance layer in the upper region of the first contact hole.

20 Claims, 12 Drawing Sheets

(56) References Cited

U.S. PATENT DOCUMENTS

| | | |
|---|---|---|
| 2010/0181549 A1 | 7/2010 | Kim et al. |
| 2011/0089394 A1 | 4/2011 | Kakegawa |
| 2016/0181204 A1 | 6/2016 | Do |
| 2018/0040817 A1 | 2/2018 | Chuang et al. |
| 2019/0123270 A1 | 4/2019 | Mo et al. |
| 2022/0085106 A1* | 3/2022 | Lee ........................ H10B 63/30 |

FOREIGN PATENT DOCUMENTS

| | | |
|---|---|---|
| KR | 10-2010-0084215 | 7/2010 |
| KR | 1020160073781 | 6/2016 |
| WO | 2018004670 | 1/2018 |
| WO | 2019005113 | 1/2019 |

* cited by examiner

VARIABLE-RESISTANCE MEMORY DEVICE

CROSS-REFERENCE TO RELATED APPLICATION(S)

This application claims benefit of priority under 35 U.S.C. § 119 to Korean Patent Application No. 10-2020-0118559 filed on Sep. 15, 2020 in the Korean Intellectual Property Office, the disclosure of which is incorporated by reference herein in its entirety.

TECHNICAL FIELD

The present disclosure relates to memory devices, and more particularly, to a variable-resistance memory device including a variable-resistance layer.

DISCUSSION OF RELATED ART

A variable-resistance memory device is a type of non-volatile memory device using current transfer characteristics of a variable-resistance layer depending on an applied voltage, and is also known as a resistance random-access memory (ReRAM or RRAM). The variable-resistance memory device has a simple structure and a relatively small cell size, as well as high compatibility with processes of logic devices such as complementary metal-oxide-semiconductor (CMOS) devices. In particular, the variable-resistance memory device may be implemented as a memory cell array having a one-transistor one-resistor (1T-1R) structure with high density and low programming energy.

SUMMARY

Embodiments of the present disclosure provide a variable-resistance memory device which may secure high reliability and uniform distribution.

According to an embodiment, a variable-resistance memory device includes a substrate having an active region, a gate structure disposed in the active region, a drain region disposed on a first side adjacent to the gate structure, a source region disposed on a second side adjacent to the gate structure, an interlayer insulating layer covering the active region and having a first contact hole and a second contact hole respectively connected to the drain region and the source region, a first contact structure filling a lower region of the first contact hole, a second contact structure filling the second contact hole, a first electrode layer disposed on the first contact structure in an upper region of the first contact hole and having a portion extending to a sidewall of the upper region of the first contact hole, a variable-resistance layer disposed on the first electrode layer to cover the first electrode layer in the upper region of the first contact hole, a sidewall spacer disposed between the extending portion of the first electrode layer and the variable-resistance layer in the upper region of the first contact hole, and a second electrode layer disposed on the variable-resistance layer in the upper region of the first contact hole.

According to an embodiment, a variable-resistance memory device includes a substrate, an insulating layer disposed on the substrate and having a contact hole, a contact structure filling a lower region of the contact hole, a first electrode layer disposed on the contact structure in an upper region of the contact hole and having a portion extending to a side surface of the upper region of the contact hole, a variable-resistance layer disposed on the first electrode layer to cover the first electrode layer in the upper region of the contact hole, a sidewall spacer disposed between the extending portion of the first electrode layer and the variable-resistance layer in the upper region of the contact hole, and a second electrode layer disposed on the variable-resistance layer in the upper region of the first contact hole.

According to an embodiment, a variable-resistance memory device includes a substrate having an active region, a gate structure disposed in the active region and extending in one direction, source/drain regions disposed in the active region on opposite sides of the gate structure, an interlayer insulating layer covering the active region and having a first contact hole and a second contact hole, respectively connected to the source/drain regions, a first contact structure filling a lower region of the first contact hole, a second contact structure filling the second contact hole, and a variable-resistance structure filling the upper region of the contact hole and having an upper surface, substantially coplanar with an upper surface of the interlayer insulating layer. The variable-resistance structure includes a first electrode layer disposed on the first contact structure and having a portion extending to a sidewall of the upper region of the first contact hole, a variable-resistance layer disposed on the first electrode layer to cover the first electrode layer, a sidewall spacer disposed between the extending portion of the first electrode layer and the variable-resistance layer, and a second electrode layer disposed on the variable-resistance layer. The second electrode layer and the variable-resistance layer are exposed to an upper surface of the variable-resistance structure.

BRIEF DESCRIPTION OF THE DRAWINGS

The above and other embodiments of the present disclosure will be more clearly understood from the following detailed description when taken in conjunction with the accompanying drawings, in which.

DETAILED DESCRIPTION

Hereinafter, embodiments of the present disclosure will be described with reference to the accompanying drawings.

Figure 1:
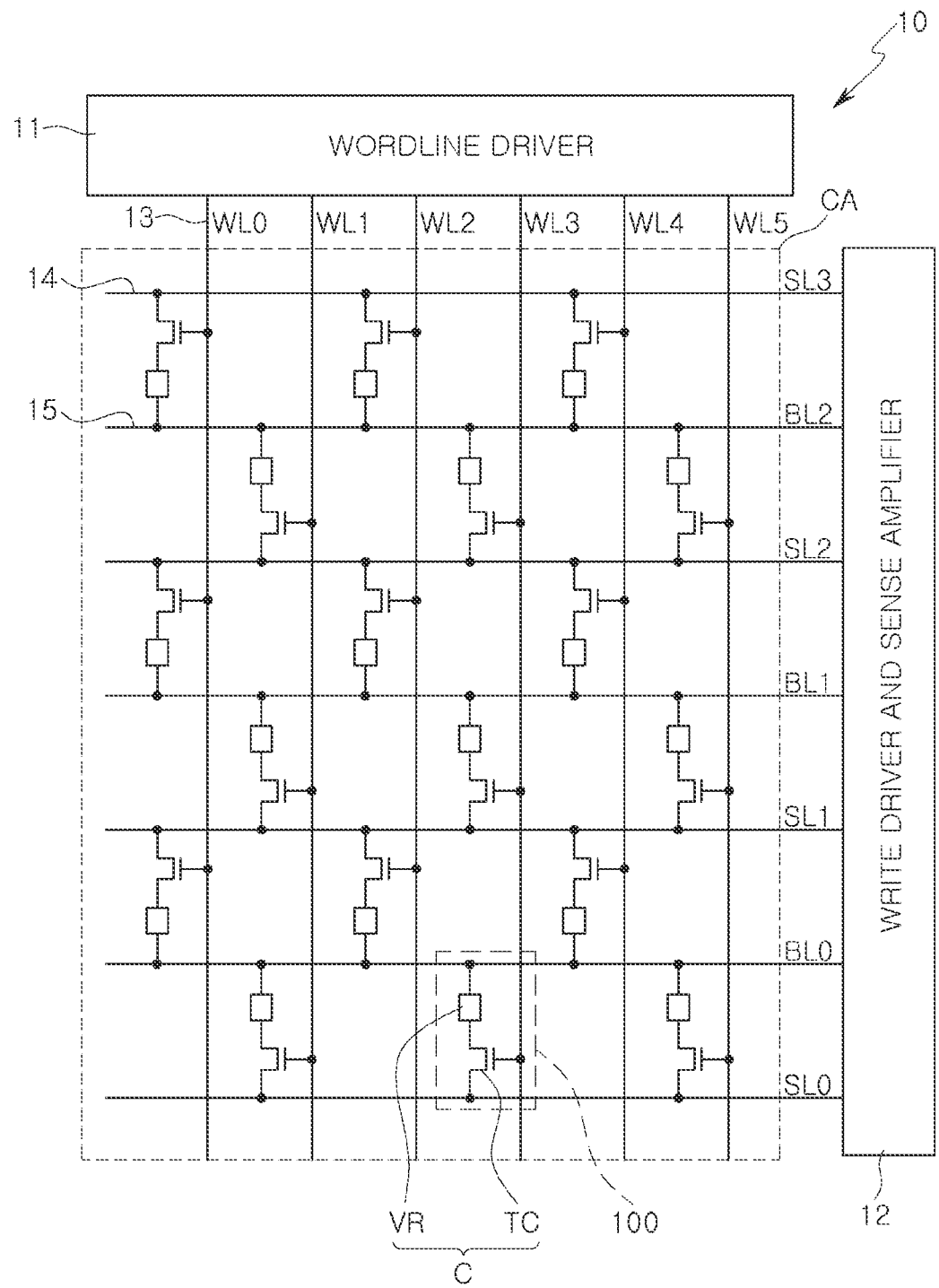
FIG. 1 is a circuit diagram of a variable-resistance memory device according to an embodiment of the present disclosure.

FIG. 1 illustrates a variable-resistance memory device according to an embodiment.

A variable-resistance memory device 10 may include a memory cell array CA, a wordline driver region 11, and a write driver and sense amplifier region 12. The memory cell array CA may include a plurality of memory cells C arranged in a matrix. Each of the memory cells C may include a cell transistor TC and a variable-resistance structure VR.

The memory cell array CA may include a plurality of wordlines (WL0 to WL5) 13, a plurality of source lines (SL0 to SL3) 14, and a plurality of bitlines (BL0 to BL2) 15. In FIG. 1, the number of the wordlines (WL0 to WL5) 13, the number of the source lines (SL0 to SL3) 14, and the number of the bitlines (BL0 to BL2) 15 are provided for ease of description without limitation thereto.

The cell transistor TC may be turned on or off based on a voltage of the wordlines (WL0 to WL5) 13. The cell transistor TC may be referred to as a switching element. For example, the cell transistor TC may be a MOS transistor. When the cell transistor TC is turned on, current may flow between the bitline BL0, the variable-resistance structure VR, and the source line SL0, and data may be written to the variable-resistance structure VR or data may be read from the variable-resistance structure VR.

For example, a single memory cell semiconductor structure 100, of at least one of the memory cells C illustrated in FIG. 1, may be electrically connected to a wordline WL3 among the wordlines (WL0 to WL5) 13, a source line SL0 among the source lines (SL0 to SL3) 14, and a bitline BL0 among bitlines (BL0 to BL2) 15.

Figure 2:
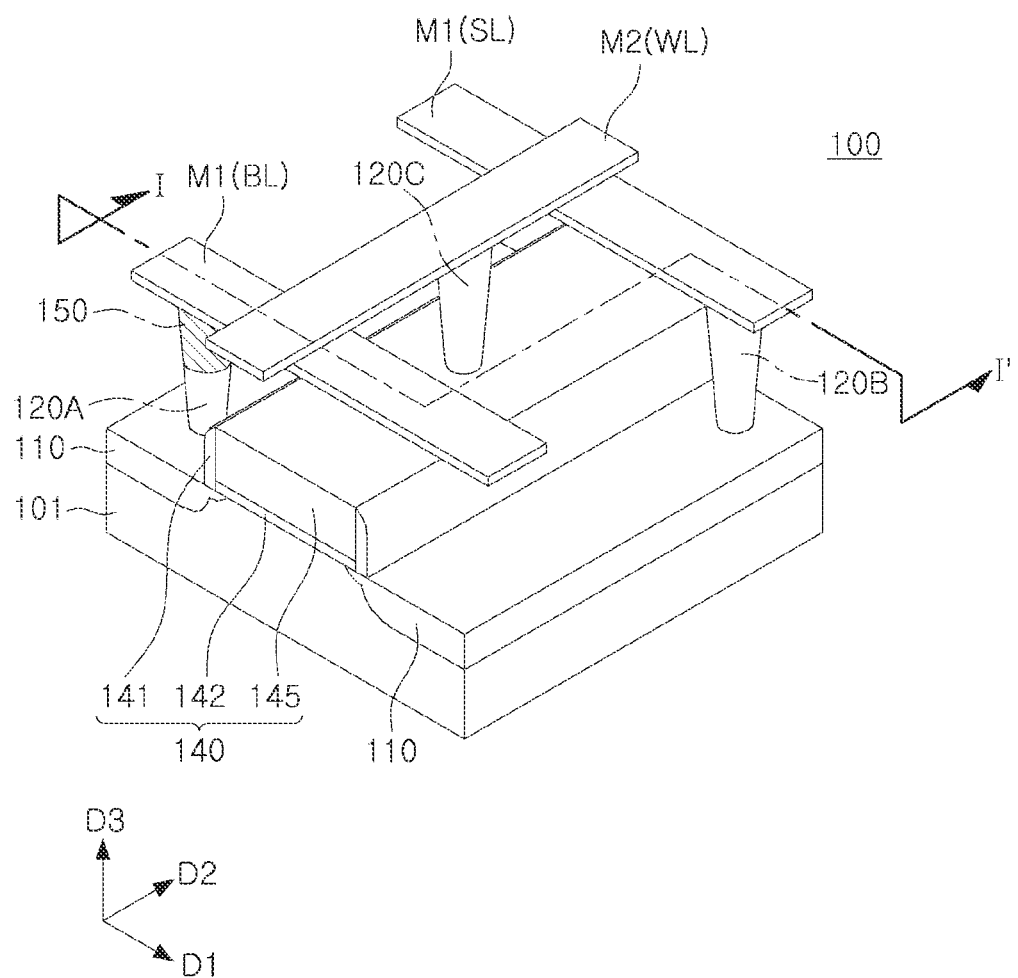
FIG. 2 is a perspective view diagram of a memory cell employable in the variable-resistance memory device of FIG. 1.
Figure 3:
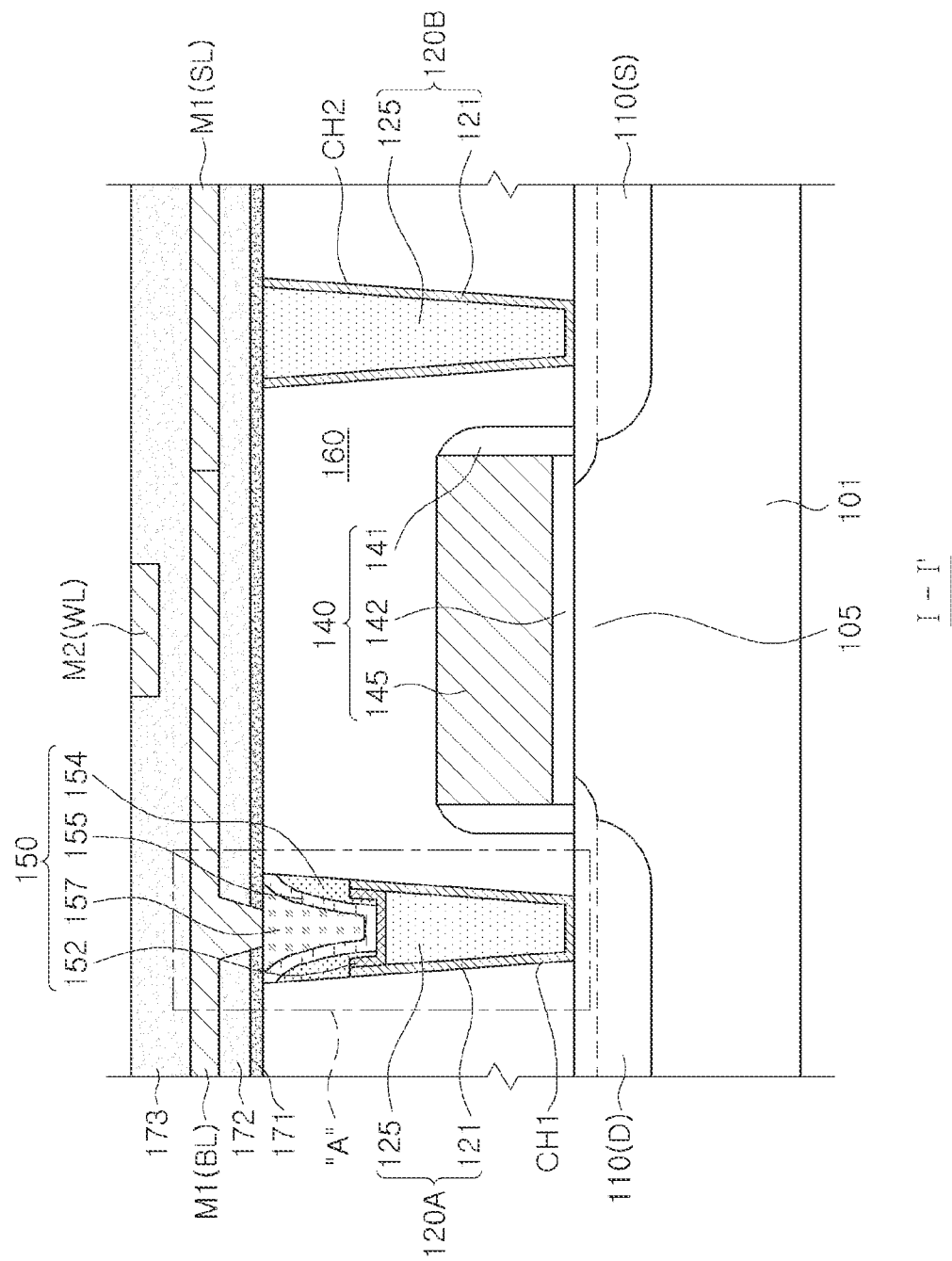
FIG. 3 is a side cross-sectional view diagram of the memory cell of FIG. 2, taken along the line I-I' of FIG. 2.

The single memory cell semiconductor structure 100 of FIG. 1 may be implemented in a semiconductor device illustrated in FIGS. 2 and 3. In this embodiment, a cell transistor TC may be implemented as a planar-type MOS transistor, and the variable-resistance structure VR of FIG. 1 may be implemented as a variable-resistance structure 150 of FIGS. 2 and 3 disposed in a certain region CH1_b of FIG. 4A of a single contact hole CH1 for a planar-type transistor.

FIG. 2 illustrates a single memory cell semiconductor structure 100 corresponding to a memory cell C of FIG. 1, and FIG. 3 illustrates the single memory cell semiconductor structure 100 of FIG. 2, with a side cross-sectional view taken along line I-I' of FIG. 2.

Referring to FIGS. 2 and 3, the single memory cell semiconductor structure 100 corresponding to a memory cell C may include a planar-type Metal-Oxide Semiconductor (MOS) transistor, disposed on an active region 105 of a substrate 101, and a variable-resistance structure 150.

The substrate 101 may include a group IV semiconductor such as Si or Ge, a IV-IV compound semiconductor such as SiGe or SiC, or a III-V compound semiconductor such as GaAs, InAs, or InP. The substrate 101 may have the active region 105. The active region 105 may be a conductive region such as a well doped with impurities or a structure doped with impurities. For example, the active region 105 may be an N-type well for a PMOS transistor, or a P-type well for an NMOS transistor.

In this embodiment, the planar-type MOS transistor may include a gate structure GS, disposed in one region of the active region 105, and source/drain regions 110 disposed on opposite sides the active region 105 adjacent to a gate structure 140. The gate structure 140 may extend in a second direction (for example, a direction D2). The source/drain regions 110 may be arranged in a first direction (for example, a direction D1) on opposite sides adjacent to the gate structure 140.

The gate structure 140 may include a gate spacer 141, a gate insulating layer 142, and a gate electrode 145. The gate insulating layer 142 and the gate electrode 145 may be sequentially disposed on the active region 105. The gate spacers 141 may be disposed on both sides of the gate insulating layer 142 and the gate electrode 145, and may extend in the second direction (for example, a direction D2).

For example, the gate insulating layer 142 may include at least one of a silicon oxide layer, a silicon nitride layer, a silicon oxynitride layer, and a high-k dielectric layer. The high-k dielectric layer refers to insulating materials having a higher dielectric constant than the silicon oxide layer, and may include tantalum oxide, titanium oxide, hafnium oxide, zirconium oxide, aluminum oxide, yttrium oxide, niobium oxide, cesium oxide, indium oxide, iridium oxide, barium strontium titanate (BST), and/or zirconate titanate (PZT). The gate insulating layer 142 may have a single-layer structure or a multilayer structure.

The gate electrode 145 may include polysilicon (poly-Si) doped with impurities or a conductive material having low resistivity and a high work function. For example, the gate electrode 145 may include a metal such as tungsten (W) or molybdenum (Mo), or a conductive metal compound such as titanium nitride, tantalum nitride, tungsten nitride, and titanium aluminum nitride.

The gate spacer 141 may be a silicon oxide layer or a silicon nitride layer. The active regions 105 on opposite sides adjacent to the gate structure 141 may include source/drain regions 110 doped with impurities. The source/drain regions 110 employed in this embodiment may include a lightly doped region, formed before the gate spacer 141 is formed, and a heavily doped region formed after the gate spacer 141 is formed. In the case of a P-type MOS transistor, the source/drain regions 110 may be doped with P-type impurities; for example, boron (B), indium (In), gallium (Ga), boron trifluoride (BF$_3$), or the like. In the case of an N-type MOS transistor, the source/drain regions 110 may be doped with N-type impurities such as phosphorus (P), nitrogen (N), arsenic (As), antimony (Sb), and/or the like.

An interlayer insulating layer 160 may be disposed on the substrate 101 to cover the gate structure 140 and the source/drain regions 110. The interlayer insulating layer 160 may have a first contact hole CH1 and a second contact hole CH2, respectively connected to the source/drain regions (D and S) 110. That is, the first contact hole CH1 is connected to the drain region 110(D), and the second contact hole CH2 is connected to the source region 110(S).

A second contact structure 120B may be disposed in the second contact hole CH2, and a first contact structure 120A may be disposed in the first contact hole CH1. The interlayer insulating layer 160 may include a silicon oxide or a silicon oxide-based insulating material; for example, tetraethyl orthosilicate (TEOS), undoped silicate glass (USG), phosphosilicate glass (PSG), borosilicate glass (BSG), borophosphosilicate glass (BPSG), fluoride silicate Glass (FSG), spin on glass (SOG), tonen silazane (TOSZ), or the like or combinations thereof. The interlayer insulating layer 160 may be formed using a chemical vapor deposition (CVD) process or a spin coating process, without limitation thereto.

In this embodiment, each of the first and second contact structures 120A and 120B may include a conductive barrier layer 121 and a contact plug 125. However, the second contact structure 120B may fill substantially the entire region of the second contact hole CH2, whereas the first contact structure 120A may fill a lower region CH1_a of the first contact hole CH1. The variable-resistance structure 150 may be disposed in an upper region CH1_b of the first contact hole CH1.

The variable-resistance structure 150 may include a first electrode layer 152 disposed on the first contact structure 120A, a variable-resistance layer 155 disposed on the first electrode layer 152, and a second electrode layer 157 disposed on the variable-resistance layer 155. The variable-resistance structure 150 may include a sidewall spacer 154 formed along a sidewall of an upper region CH1_b of the first contact hole CH1, and at least a certain region of the sidewall spacer 154 may be disposed between a certain region of the first electrode layer 152 and the variable-resistance layer 155. An upper surface of the first contact structure 120A may be disposed on a level lower than a level of an upper surface of the second contact structure 120B. A difference between the levels of the upper surfaces of the first and second contact structures 120A and 120B may define a difference of the variable-resistance structure 150.

Figure 4A:
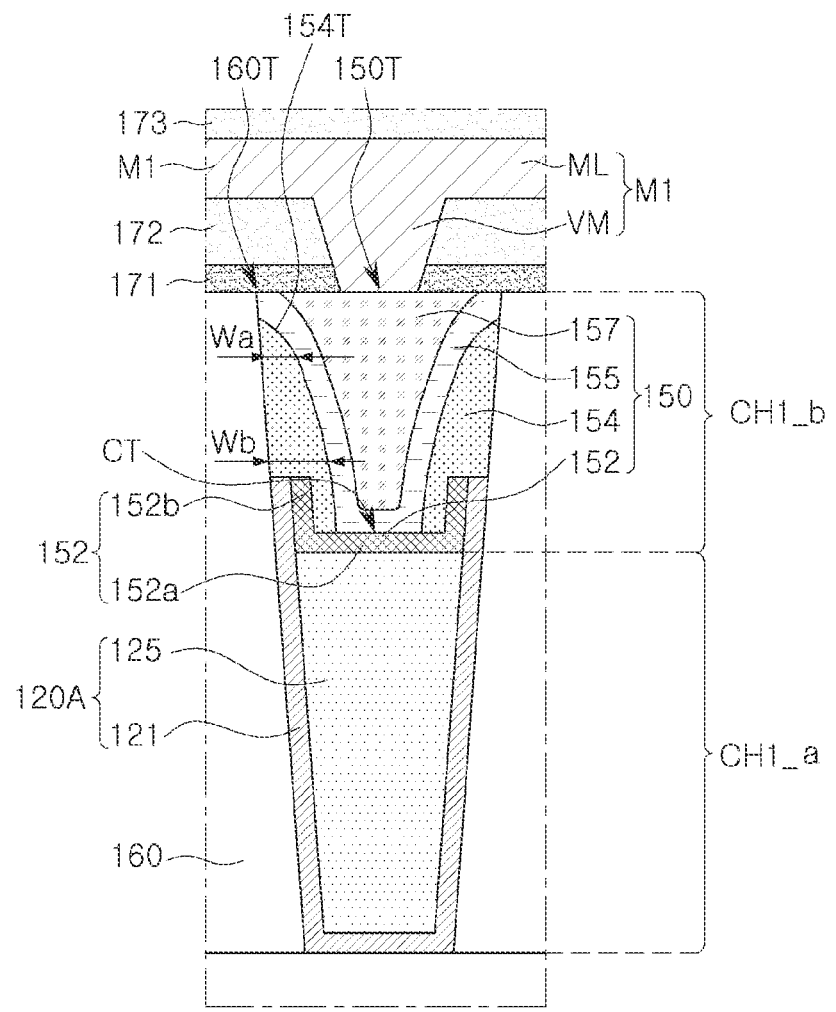
FIG. 4A is a cross-sectional view diagram of enlarged portion "A" (a first contact structure) of the memory cell of FIG. 3.
Figure 4B:
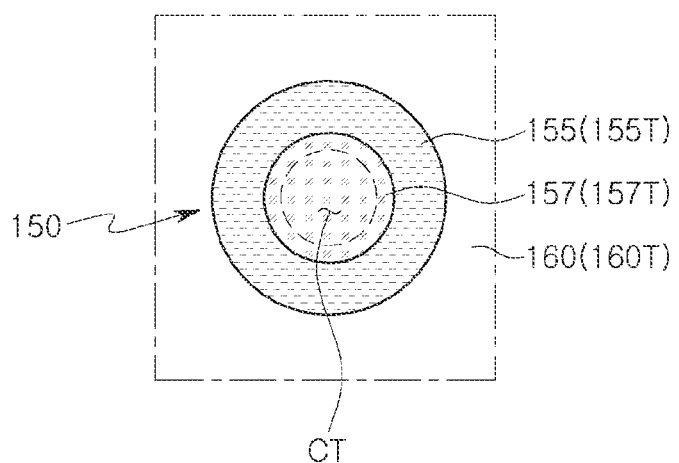
FIG. 4B is a plan view diagram of enlarged portion "A" of the memory cell of FIG. 3.

The variable-resistance structure 150, employed in this embodiment, will be described in more detail with reference to FIGS. 4A and 4B. FIGS. 4A and 4B illustrate cross-sectional views and a plan view, respectively, of enlarged portion "A" of the memory cell of FIG. 3, respectively.

Referring to FIGS. 3 and 4A, in the upper region CH1_a of the first contact hole, the first electrode layer 152 may have a first portion 152a, disposed on the contact plug 125, and a second portion 152b extending along the sidewall of the upper region CH1_a of the first contact hole. The sidewall spacer 154 may be disposed between an extending second portion 152a of the first electrode layer 152 and the variable-resistance layer 155. The sidewall spacers 154 may inhibit parasitic components generated when the second portion 152b of the first electrode layer 152 is in direct contact with the variable-resistance layer 155. In addition, the first portion 152a of the first electrode layer 152, exposed by the sidewall spacer 154, may be provided as a contact region CT with the variable-resistance layer 155.

As illustrated in FIG. 1, in the plurality of memory cells C, the second portions 152b of the first electrode layer 152 may be formed to have different extension lengths to vary switching uniformity of the memory cell C. However, since no parasitic component is generated by the introduction of the sidewall spacer 154, variance of switching uniformity due to such a parasitic component may be prevented. Due to such inhibition of a parasitic component as well as a limitation of the first electrode layer 152 and the contact region CT of the variable-resistance layer 154 to the first portion 152a, energy efficiency may be improved.

In an embodiment, the variable-resistance layer 155 may include a material layer having electrical resistance changed by oxygen vacancies or oxygen migration. The variable-resistance layer 155 may include a perovskite-based material or a transition metal oxide. Variable-resistance layers may be used each alone or in combination thereof. For example, the perovskite-based material may include $SrTiO_3$ (STO), $BaTiO_3$ (BTO), and $Pr_{1-x}Ca_xMnO_3$ (POMO). The transition metal oxide may include titanium oxide ($TiO_x$), zirconium oxide ($ZrO_x$), aluminum oxide ($AlO_x$), tantalum oxide ($TaO_x$), tungsten oxide ($WO_x$), and hafnium oxide ($HfO_x$). In this case, the variable-resistance memory device 10, for example, the memory cell C, may be a resistive random-access memory (ReRAM or RRAM).

For example, at least one of the first and second electrode layers 152 and 157 may include a metal nitride such as titanium nitride ($TiN_x$), tungsten nitride ($WN_x$), or tantalum nitride ($TaN_x$), a metal silicon nitride such as titanium silicon nitride ($TiSiN_x$), or a metal such as titanium (Ti) or tungsten (W). The sidewall spacer 154 may include, for example, a silicon nitride or a silicon oxynitride, without limitation thereto.

As illustrated in FIG. 4A, the sidewall spacer may extend along a portion of the interlayer insulating layer 160 surrounding the upper region CH1_b of the first contact hole CH1 between the second portion 152b of the first electrode layer 152 and the variable-resistance layer 155. An upper end 154T of the sidewall spacer 154 may be disposed to be lower than an upper surface 160T of the interlayer insulating layer 160. The variable-resistance layer 155 may extend to the portion of the interlayer insulating layer 160 along the sidewall spacers 154. A width Wa of a region of the sidewall spacer 154, adjacent to the upper end 154T, may be smaller than a width Wb of another region of the sidewall spacer 154.

The conductive barrier layer 121 may have a portion disposed between the interlayer insulating layer 160 and the second portion 152b of the first electrode layer 152. In this embodiment, an upper end of the conductive barrier layer 121 may have substantially the same height as an upper end of the second portion 152b of the first electrode layer 152.

The second electrode layer 157 may have an upper surface, substantially coplanar with the upper surface of the interlayer insulating layer 160. An upper end 155T of the variable-resistance layer 155 may have an upper surface, substantially coplanar with the upper surface of the interlayer insulating layer 160. As illustrated in FIGS. 4A and 4B, the upper surface of the variable-resistance structure 150 may be provided together with the upper end 157T of the second electrode layer 157 by the upper end 155T of the variable-resistance layer 155. When viewed from above, the upper end 155T of the second electrode layer 157 may be surrounded by the variable-resistance layer 155, but the present disclosure is not limited thereto.

As described above, the upper surface of the variable-resistance structure 150 may have a surface, substantially coplanar with the upper surface 160T of the interlayer insulating layer 160, and the second electrode layer 157 may be exposed through the upper surface of the variable-resistance structure 150. Such an exposed region of the second electrode layer 157 may be connected to a first interconnection line M1 (BL).

Referring to FIGS. 2 and 3 together with FIG. 1, the first contact structure 120A and the second contact structure 120B may be connected to the drain region D and the source region S, respectively. Similarly, the third contact structure 120C may be connected to the gate structure 140, in particular, the gate electrode 145. The first to third contact structures 120A, 120B, and 120C may extend in a third direction (for example, a direction D3) to be connected to the first interconnection lines M1 (for example, BL and SL) and the second interconnection line M2 (WL), respectively.

In this embodiment, the two first interconnection lines M1 may extend in the first direction (for example, the direction D1) to be connected to the first and second contact structures D1) 120A and 120B to be provided as a bitline BL and a source line SL, respectively. The second interconnection line M2 may be disposed on a level different from a level of the first interconnection lines M1, and may extend in the second direction (for example, the direction D2) intersecting the first direction. The second interconnection line M2 may be connected to the third contact structure 120C to be provided as a wordline WL. A first dielectric layer 172 and a second dielectric layer 173 may be disposed on the interlayer insulating part 160.

An etch-stop layer 171 may be disposed between the interlayer insulating portion 160 and the first dielectric layer 172. For example, the etch-stop layer 171 may include a silicon nitride, a silicon carbonitride, an aluminum nitride, or an aluminum oxide. For example, each of the first and second dielectric layers 172 and 173 may include a silicon oxide, a silicon nitride, or a silicon oxynitride. Each of the interconnection lines M1 and M2 according to this embodiment may include metal lines ML, extending in the first direction, and contact vias VM disposed between the first and second contact structures 120A and 120B and the metal lines ML. The interconnection lines M1 and M2 may be formed by a dual damascene process.

Returning to FIG. 1, the cell transistor TC implemented as a planar-type MOS transistor may operate as a switching element to be turned on or turned off based on a voltage on the wordlines (WL0 to WL5) 12. When the cell transistor TC is turned on, current may flow between the bitline BL0, the variable-resistance structure 150 (in particular, the variable-resistance layer 155), and the source line SL0, and data may be written to the variable-resistance layer 155 or data may be read from the variable-resistance layer 155.

The wordlines (WL0 to WL5) 120 may respectively extend in the second direction (for example, the direction D2) while being spaced apart from each other in the first direction (for example, the direction D1) to be disposed substantially in parallel. Each of the wordlines (WL0 to WL5) 120 may be driven by the wordline driver 12. The wordline driver 12 may be disposed in the second direction (for example, the direction D2) of the memory cell array CA.

For example, to select one wordline WL3, among the wordlines (WL0 to WL5) 120, the wordline driver 12 may output a voltage for turning on the cell transistor TC to the corresponding wordline WL3. The second direction (for example, the direction D2) may be different from the first direction (for example, the direction D1). The second direction (for example, the direction D2) may cross or be substantially perpendicular to the first direction (for example, the direction D1).

The source lines (SL0 to SL3) 130 may respectively extend in the first direction (for example, the direction D1) while being spaced apart from each other in the second direction (for example, the direction D2) to be disposed substantially in parallel. Similar to the source lines (SL0 to SL3) 130, the bitlines (BL0 to BL2) 150 may respectively extend in the first direction (for example, the direction D1) while being spaced apart from each other in the second direction (for example, the direction D2) to be disposed substantially in parallel.

The source lines (SL0 to SL3) 130 may be connected to sources or drains of the memory cells C. The bitlines (BL0 to BL2) 150 may be connected to one end of the variable-resistance structure 150; for example, to the second electrode layer 157. The variable-resistance layer 155 may be connected to the sources S or the drains D of the memory cells C. The source lines (SL0 to SL3) 130 and the bitlines (BL1 to BL2) 150 may be connected to the write driver and sense amplifier 13 disposed in the first direction of the memory cell array CA.

A plurality of source line drivers for driving the source lines (SL0 to SL3) 130 and a plurality of bitline drivers for driving the bitlines (BL0 to BL2) 150 may disposed in the write driver and sense amplifier region 13. Sense amplifiers, respectively electrically connected to the bitlines BL0 to BL2, may be disposed in the write driver and sense amplifier region 13.

The variable-resistance structure 150 may include a material layer having a resistance value changed by an applied voltage; for example, a variable-resistance layer (155 of FIG. 3). A variable-resistance structure VR may have a resistance value corresponding to a data value. For example, the variable-resistance structure VR may have a resistance value lower than a predetermined reference resistance value to store data "0." In contrast, the variable-resistance structure VR may have a resistance value higher than a predetermined reference resistance value to store data "1." The data "0" and the data "1" depending on the resistance value are exemplary, and may be inverted to each other.

As described above, the variable-resistance structure 150 employed in this embodiment may inhibit different parasitic components in a memory cell by introducing the sidewall spacer 154 between the second portion 152b of the first electrode layer 152 and the variable-resistance layer 155. Accordingly, deterioration of switching uniformity may be prevented. In addition, since the contact region CT between the first electrode layer 152 and the variable-resistance layer 154 is limited to the first portion 152a due to the introduction of the sidewall spacer 154, energy efficiency of the variable-resistance memory device 10 may be improved.

Figure 5:
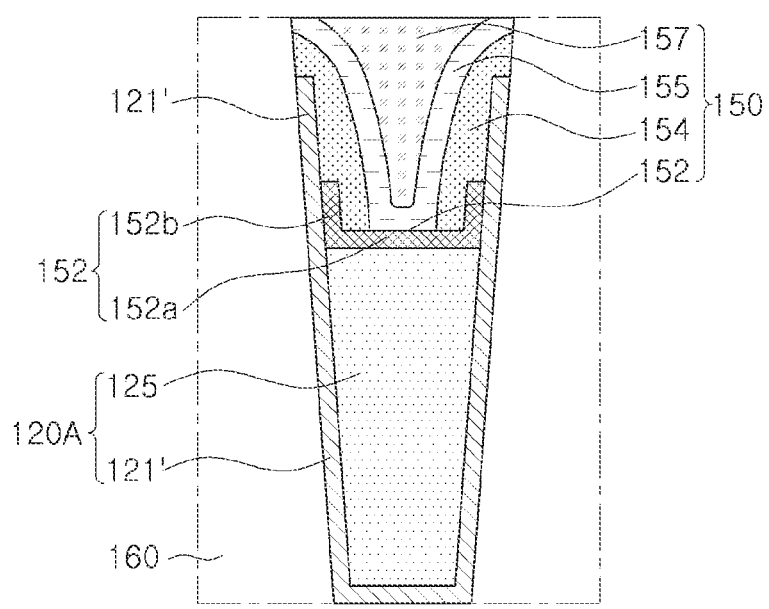
FIG. 5 is a cross-sectional view diagram illustrating a portion of a variable-resistance memory device according to an embodiment of the present disclosure.
Figure 6:
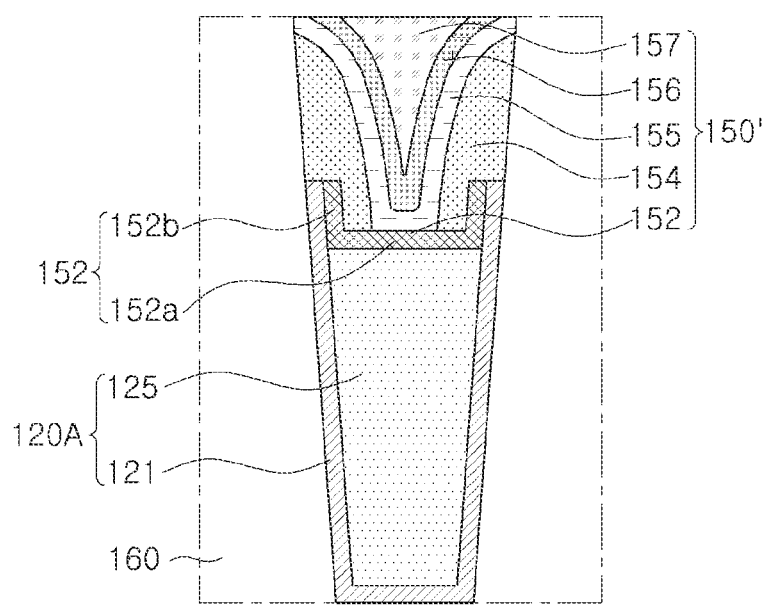
FIG. 6 is a cross-sectional view diagram illustrating a portion of a variable-resistance memory device according to an embodiment of the present disclosure.

FIGS. 5 and 6 are cross-sectional views illustrating portions of variable-resistance memory devices according to various embodiments, respectively.

Referring to FIG. 5, it will be understood that a variable-resistance memory device according to this embodiment may have a structure similar to the structure of the single memory cell semiconductor structure 100 illustrated in FIGS. 1 to 4, except that an upper end of a conductive barrier layer 121' extends to be higher than an upper end of a first electrode layer 152. In addition, components of this embodiment may be understood with reference to the descriptions of the same or similar components of the single memory cell semiconductor structure 100 illustrated in FIGS. 1 to 4B, unless otherwise specified.

Similar to the above-described embodiment, a variable-resistance structure 150 may include a first electrode layer 152 disposed on a first contact structure 120A, a variable-resistance layer 155 disposed on the first electrode layer 152, and a second electrode layer 157 disposed on the variable-resistance layer 155. The variable-resistance structure 150 may be disposed between an extending portion 152b of the first electrode layer 152 and the variable-resistance layer 155 in an upper region of a first contact hole.

Unlike the above-described embodiment, an upper end of the conductive barrier layer 121' employed in the present exemplary embodiment may have a higher level than the upper end of the second portion 152b of the first electrode layer 152. An upper region of the conductive barrier layer 121' may be in direct contact with the sidewall spacers 154, which may be a structure formed due to a difference in materials, in particular, etching rates between the conductive barrier layer 121' and the first electrode layer 152. For example, such a structure may be obtained when an etching rate of the conductive barrier layer 121' is lower than an etching rate of the first electrode layer 152 in an etch-back process performed on both the conductive barrier layer 121' the first electrode layer 152.

Referring to FIG. 6, it will be understood that a variable-resistance memory device according to this embodiment may have a structure similar to the structure of the single memory cell semiconductor structure 100 illustrated in FIGS. 1 to 4B, except that an oxygen reservoir layer 156 is additionally provided. In addition, components of this embodiment may be understood with reference to the descriptions of the same or similar components of the single memory cell semiconductor structure 100 illustrated in FIGS. 1 to 4B, unless otherwise specified.

The oxygen reservoir layer 156 may be disposed between a variable-resistance layer 155 and a second electrode layer 157. The oxygen reservoir layer 156 may include oxygen ions and/or oxygen vacancies. The oxygen reservoir layer 156 may act as an oxygen supplying layer for the variable-resistance layer 155. Similar to the oxygen reservoir layer 156, the variable-resistance layer 155 may also include oxygen ions and/or oxygen vacancies. The variable-resistance layer 155 may exchange oxygen ions and/or oxygen vacancies with the oxygen reservoir layer 156, which may effectively induce a variation in resistance of the variable-resistance layer 155. In an embodiment, the oxygen reservoir layer 156 may include an oxygen-poor material, as compared with a material satisfying a stoichiometric ratio. An oxygen concentration of the oxygen reservoir layer 156 may be higher than an oxygen concentration of the variable-resistance layer 155. For example, the variable-resistance layer 155 may include $TiO_2$ or $Ta_2O_5$, and the oxygen reservoir layer 156 may include $TiO_x$ (x<2) or $TaO_y$ (y<2.5).

FIGS. 7A to 7H are process cross-sectional views illustrating a method of manufacturing a variable-resistance memory device (in particular, a first contact structure+a variable-resistance structure) according to an embodiment. The description of the method will be understood to be description of processes of forming a combination of the first contact structure 120A and the variable-resistance structure 150 described in FIGS. 1 to 4B.

Figure 7:
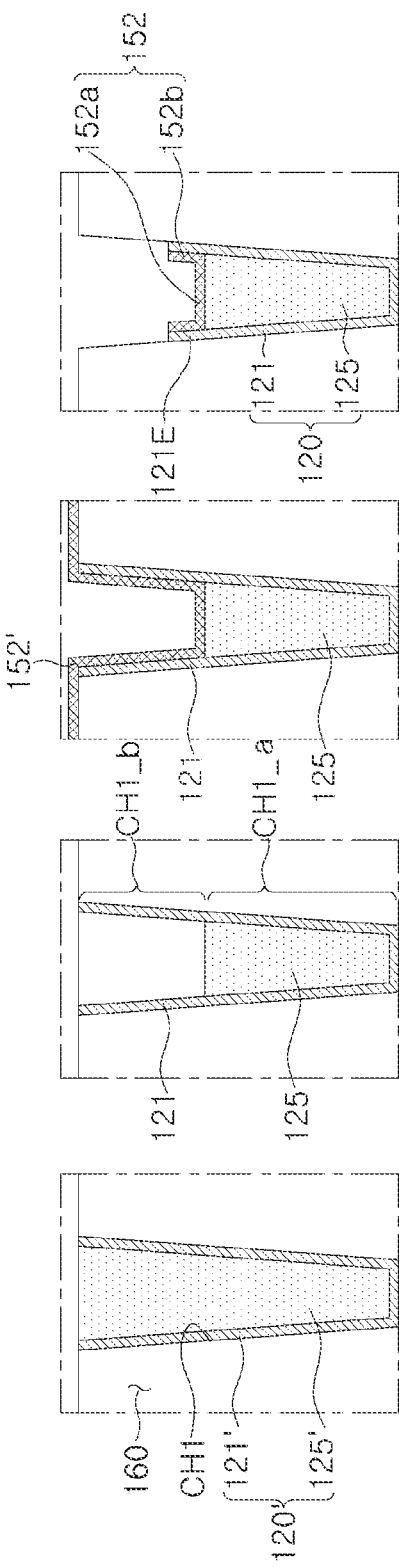
FIGS. 7A to 7H are process cross-sectional view diagrams illustrating a method of manufacturing a variable-resistance memory device including a first contact structure and a variable-resistance structure, according to an embodiment of the present disclosure.

Referring to FIG. 7A, a preliminary contact structure 120' may be formed in a first contact hole CH1 of an interlayer insulating layer 160.

The first contact hole CH1 may be connected to the source/drain regions (110 of FIG. 3). A conductive barrier layer 121' may be conformally formed in the first contact hole CH1, and a contact plug 125' may be formed to fill the first contact hole CH1. Then, a preliminary contact structure 120' having an upper surface, substantially coplanar with an upper surface of an interlayer insulating layer 160, may be formed using a chemical mechanical polishing (CMP) process. For example, the conductive barrier layer 121' may include Ta, TaN, Mn, MnN, WN, Ti, TiN, or combinations thereof, and the contact plug 125' may include Cu, Co, Mo, Ru, W, or alloys thereof. In an embodiment, the first contact hole CH1 is not limited to a shape connected to a source/drain region, and may be connected to another active region or another metal line.

Referring to FIG. 7B, a portion of the preliminary contact structure 120' may be etched to empty an upper region CH1_b of the first contact hole CH1. A region in which a portion of the preliminary contact structure 120' is removed, for example, the upper region CH1_b of the first contact hole CH1, may secure a space for a variable-resistance structure. In this embodiment, only the contact plug 125' of the preliminary contact structure 120' may be selectively removed, while the conductive barrier layer 121' may remain. In an embodiment, the conductive barrier layer 121' may be removed together with the contact plug 125' to provide the upper region CH1_b of the first contact hole CH1.

Referring to FIG. 7C, a first electrode layer 152' may be formed on the contact plug 125. A first electrode layer 152' may be formed on an upper surface of the contact plug 125, a sidewall of the upper region CH1_a of the first contact hole CH1, and an upper surface of the interlayer insulating layer 160. The first electrode layer 152' may be formed using atomic layer deposition (ALD), chemical vapor deposition (CVD), or physical vapor deposition (PVD). For example, the first electrode layer 152' may include a metal nitride such as titanium nitride ($TiN_x$), tungsten nitride ($WN_x$), tantalum nitride ($TaN_x$), a metal silicon nitride such as titanium silicon nitride ($TiSiN_x$), or a metal such as titanium (Ti) and tungsten (W).

Referring to FIG. 7D, the first electrode layer 152' and the conductive barrier layer 121' may be etched back to form a first electrode layer 152 having an adjusted upper end level a conductive barrier layer having an adjusted upper end level. The present process may allow upper ends of the first electrode layer 152 and the conductive barrier layer 121 to be disposed on a lower level than the upper surface of the interlayer insulating layer. The first electrode layer 152 may have a first portion 152a, disposed on the contact plug 125, and a second portion 152b extending along a sidewall of the upper region CH1_a of the first contact hole CH1. When the conductive barrier layer 121 has an etching rate similar to an etching rate of the first electrode layer 152, as in the present process, levels of upper ends of the conductive barrier layer 121 and the first electrode layer 152 may be substantially the same, but the present disclosure is not limited thereto (see FIG. 5).

Referring to FIG. 7E, an insulating layer 154' for a sidewall spacer may be formed. Referring to FIG. 7F, the insulating layer 154' may be anisotropically etched to form a sidewall spacer 154.

The insulating layer 154' may be formed on an upper surface of the contact plug 125, a sidewall of the upper region CH1_a of the first contact hole CH1, and an upper surface of the interlayer insulating layer 160. For example, the insulating layer 154' may be formed using atomic layer deposition (ALD), chemical vapor deposition (CVD), or physical vapor deposition (PVD). The insulating layer 154' may include, for example, a silicon nitride or a silicon oxynitride.

Then, anisotropic etching may be performed to remove the insulating layer 154' from the upper surface of the contact plug 125 and the upper surface of the interlayer insulating layer 160. In this case, the sidewall spacer 154 may be disposed on a sidewall of the upper region CH1_a of the first contact hole CH1 to cover an extending second portion 152a of the first electrode layer 152. An upper end of the sidewall spacer 154 may have a lower level than the upper surface of the interlayer insulating layer 160. In an embodiment, a region adjacent to the upper end of the sidewall spacer 154 may have a smaller width than another region of the sidewall spacer. The sidewall spacer 154 may serve to prevent the second portion 152b of the first electrode layer 152 from being in direct contact with the variable-resistance layer 155, and a certain region of the first portion 152a of the first electrode layer 152 may be exposed to define a contact region CT with the variable-resistance layer 155.

Referring to FIG. 7G, after the variable-resistance layer 155 and the second electrode layer 157 are formed, a planarization process may be performed to form a variable-resistance structure 150. The variable-resistance layer 155 may include a material layer having electrical resistance changed by oxygen vacancies or oxygen migration. In this embodiment, the variable-resistance layer 155 may include titanium oxide (TiO$_x$), zirconium oxide (ZrO$_x$), aluminum oxide (AlO$_x$), tantalum oxide (TaO$_x$), tungsten oxide (WO$_x$), and hafnium oxide (HfO$_x$). For example, the second electrode layer 157 may include a metal nitride such as titanium nitride (TiN$_x$), tungsten nitride (WN$_x$), or tantalum nitride (TaN$_x$), a metal silicon nitride such as titanium silicon nitride (TiSiN$_x$), or a metal such as titanium (Ti) or tungsten (W).

The variable-resistance layer 155 may be formed by a thin-film forming process having improved step coverage characteristics or conformality. For example, the variable-resistance layer 155 may be formed by an atomic layer deposition (ALD) process. The second electrode layer 157 may be formed to fill an internal space of the first contact hole CH1. For example, the second electrode layer 157 may be formed by chemical vapor deposition (CVD) or physical vapor deposition (PVD).

A planarization process may be performed to expose the second electrode layer 157 to the upper surface of the variable-resistance structure 150. In an embodiment, the second electrode layer 157 may have an upper surface, substantially coplanar with an upper surface of the interlayer insulating layer 160. In addition, an upper end of the variable-resistance layer 157 may have a surface, substantially planar with the upper surface of the interlayer insulating layer 160.

Figure 8:
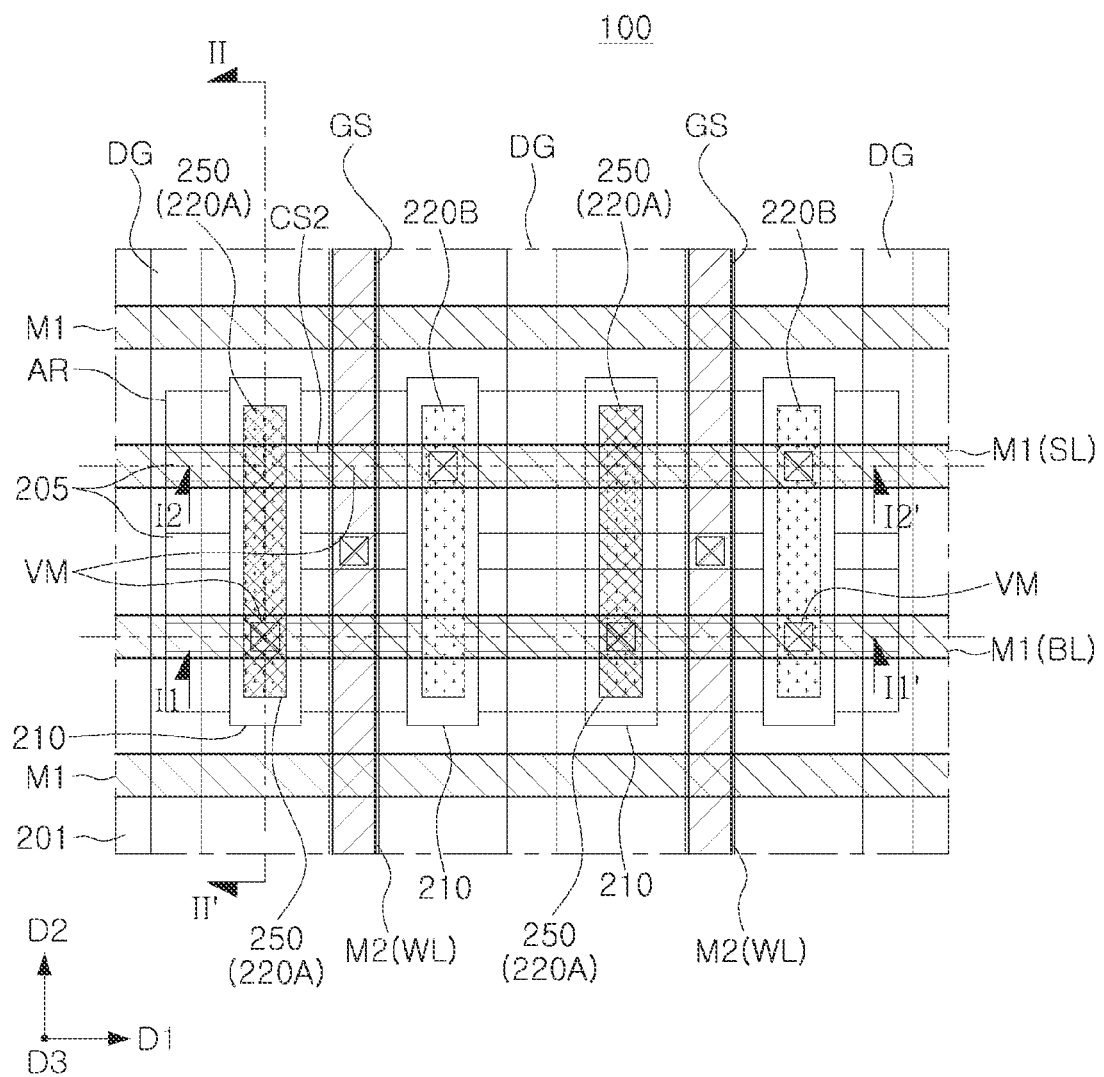
FIG. 8 is a plan view diagram of a variable-resistance memory device according to an embodiment of the present disclosure.
Figure 9A:
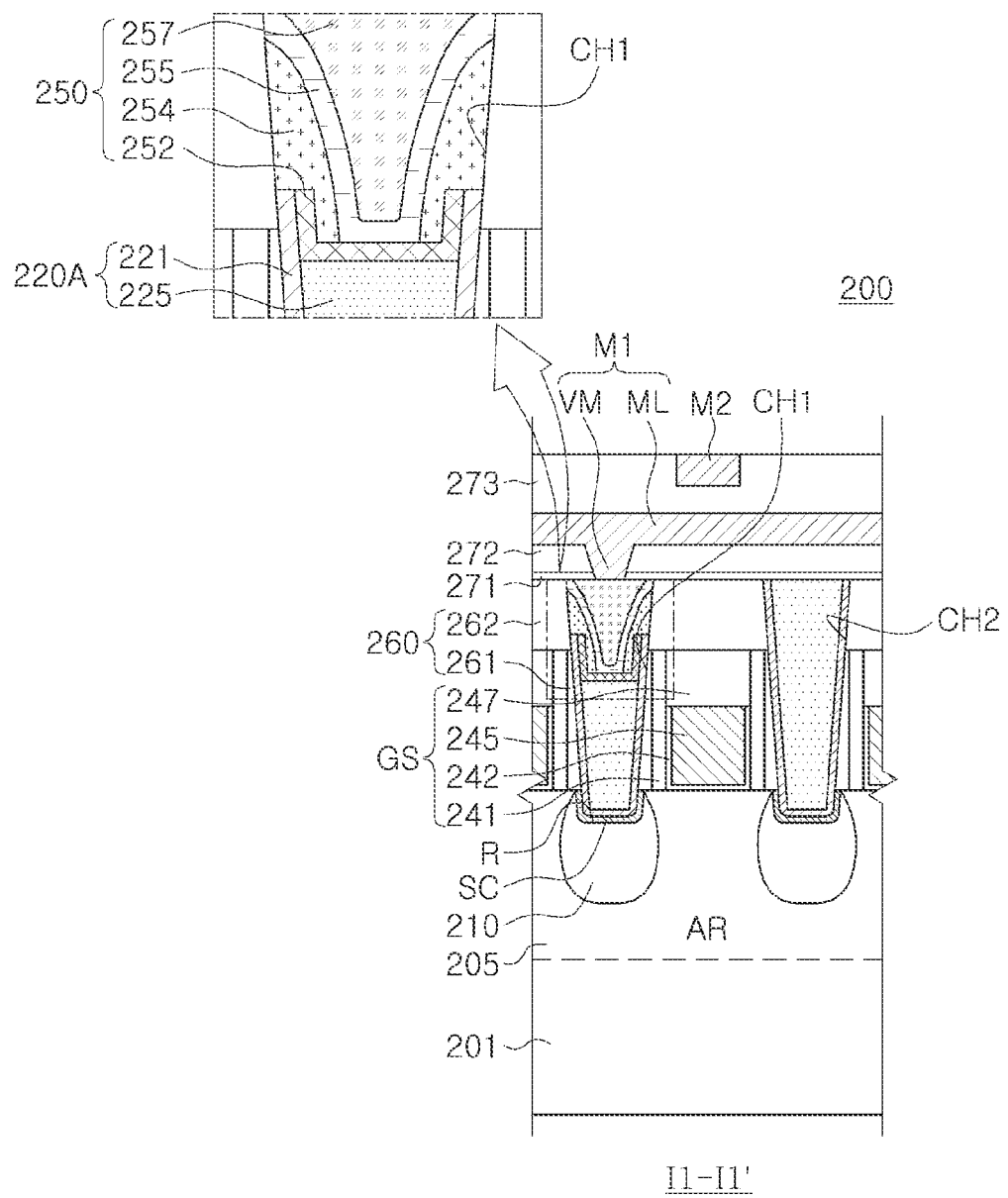
FIGS. 9A to 9C are cross-sectional view diagrams of the variable-resistance memory device of FIG. 8, respectively taken along lines I1-I1', I2-I2', and II-II'.
Figure 9B:
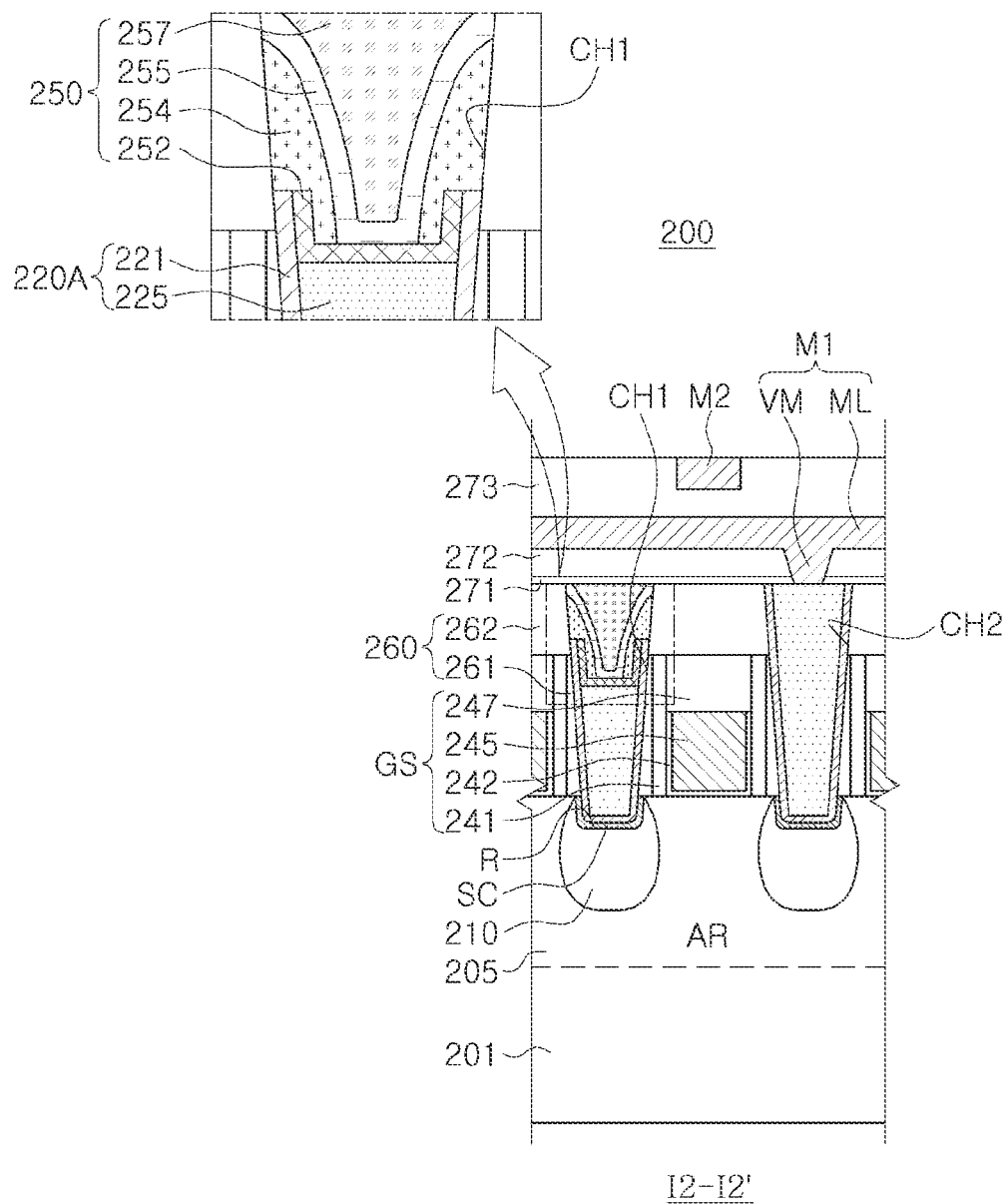
Figure 9C:
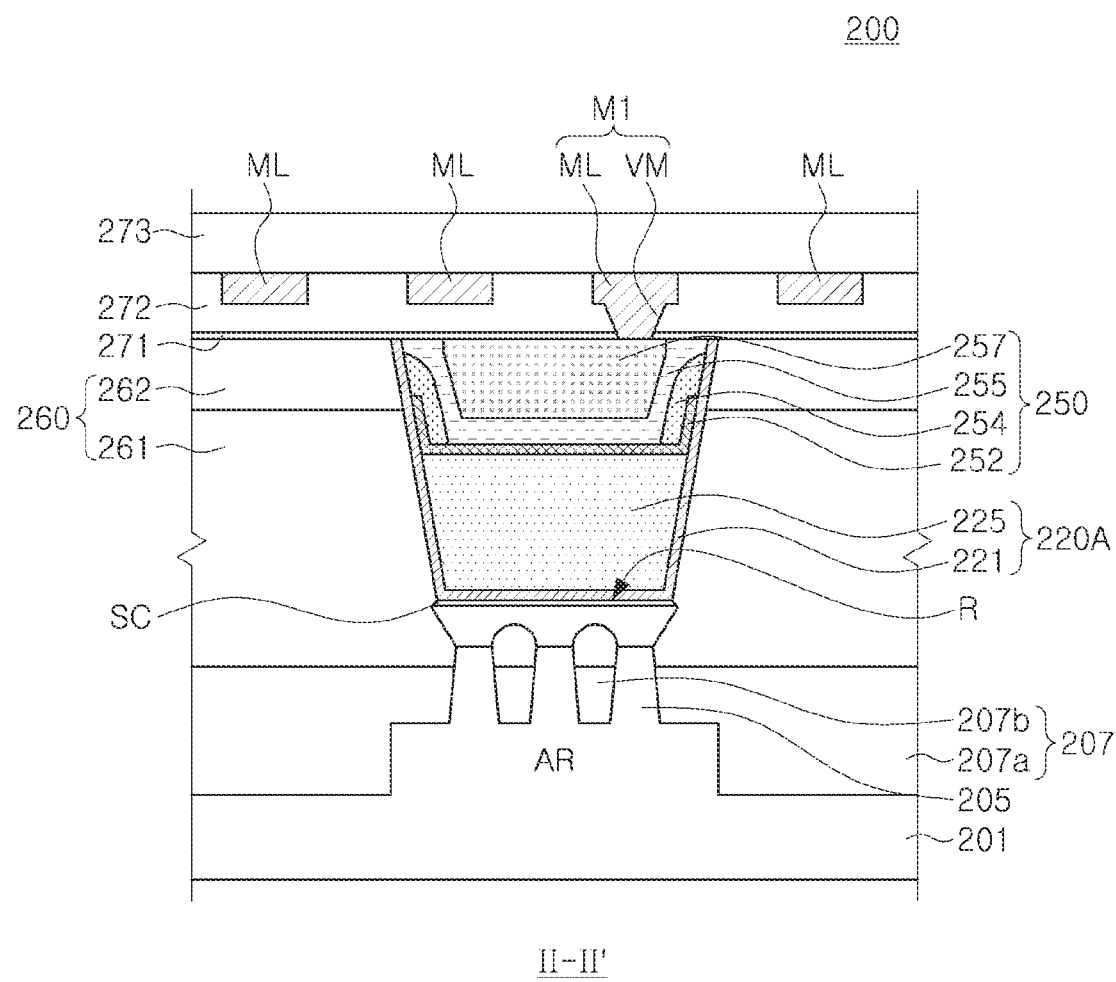

FIG. 8 illustrates a variable-resistance memory device according to an embodiment, and FIGS. 9A to 9C illustrate the variable-resistance memory device of FIG. 8, with cross-sectional views respectively taken along lines I1-I1', I2-I2', and II-II' of FIG. 8.

Referring to FIG. 8 and FIGS. 9A to 9C, a variable-resistance memory device 200 according to this embodiment may include a fin-type active region 205, extending in a first direction (e.g., a direction D1 of FIG. 8), substantially parallel to an upper surface of a substrate 201, on the substrate 201, and a gate structure GS extending in a second direction (e.g., a direction D2 of FIG. 8), different from the first direction (e.g., the direction D1 of FIG. 8), on the fin-type active region 205. Components of this embodiment may be understood with reference to the descriptions of similar components of the single memory cell semiconductor structure 100 illustrated in FIGS. 1 to 4B, unless otherwise specified. Duplicate description may be omitted.

The substrate 201 may include silicon (Si), germanium (Ge), or silicon germanium (SiGe), without limitation thereto. The substrate 201 may include an active region AR. The active region AR may be a conductive region, such as a well doped with impurities or a structure doped with impurities. For example, the active region AR may be an N-type well for a PMOS transistor or a P-type well for an NMOS transistor, without limitation thereto.

A fin-type active region 205 may be disposed on an upper surface of the active region AR. The fin-type active region 205 employed in this embodiment may have a structure protruding from the upper surface of the active region AR in a third direction (e.g., a direction D3 of FIG. 8), crossing or substantially perpendicular to the first and second directions. The fin-type active region 205 will also be referred to as an "active fin" in the specification.

In this embodiment, three active fins 205 are illustrated. However, the number of the active fins 205 is not limited thereto, and a single active fin 205 or a different plurality of active fins 205 may be provided. As illustrated in FIG. 8, the three active fins 205 may be arranged side by side in a second direction in the active region AR, and may each extend in a first direction. The active fin 205 may be provided as an active region of a transistor.

A device isolation film (207 of FIG. 8C) may define an active region AR and an active fin 205. For example, the device isolation film 207 may include an insulating material such as a silicon oxide. The device isolation region 207 may include a first isolation region 207a, defining the active region AR, and a second isolation region 207b defining the active fin 205. The first isolation region 207a may have a bottom surface deeper than a bottom surface of the second isolation region 207b. For example, the first isolation region 207a is also referred to as a deep trench isolation (DTI) region, and the second isolation region 207b is also referred to as a shallow trench isolation (STI) region. The second isolation region 207b may be disposed on the active region AR. As described above, the active fin 205 may partially protrude from an upper surface of the second isolation region 207b while penetrating through the second isolation region 207b.

As illustrated in FIG. 8, the gate structure GS may have a linear structure extending in the second direction intersecting the first direction. The gate structure GS may overlap one region of the active fin 205.

The gate structure GS may include gate spacers 241, a gate insulating layer 242 and a gate electrode 245 sequentially disposed between the gate spacers 241, and a gate capping layer 247 disposed on the gate electrode 245.

The gate electrode 245 may include doped polysilicon, a metal, a conductive metal nitride, a conductive metal carbide, or combinations thereof. For example, the gate electrode 245 may include Al, Cu, Ti, Ta, W, Mo, TaN, NiSi, CoSi, TiN, WN, TiAl, TiAlN, TaCN, TaC, TaSiN, or combinations thereof, but the present disclosure is not limited thereto. In an embodiment, the gate electrode 245 may include a work function metal-containing layer and a gap-fill metal layer. The work function metal-containing layer may include at least one metal selected from the group consisting of Ti, W, Ru, Nb, Mo, Hf, Ni, Co, Pt, Yb, Tb, Dy, Er, and Pd. The gap-fill metal layer may include a tungsten (W) layer or an aluminum (Al) layer. For example, the gate electrode 245 may have a stacked structure of TiAlC/TiN/W, a stacked structure of TiN/TaN/TiAlC/TiN/W, or a stacked structure of TiN/TaN/TiN/TiAlC/TiN/W.

The gate insulating layer 242 may be disposed on a bottom surface and a sidewall of the gate electrode 245, and may extend in the second direction along the bottom surface of the gate electrode 245. The gate insulating layer 242 may be interposed between the gate electrode 245 and the active fin 205 and between the gate electrode 245 and an upper surface of the device isolation film 207. For example, the gate insulating layer 242 may include a silicon oxide, a silicon oxynitride, a high-k dielectric material having a higher dielectric constant than the silicon oxide, or combinations thereof. A high-k dielectric layer may include a metal oxide or a metal oxynitride. For example, a high-k dielectric layer used as the gate insulating layer 242 may include HfO$_2$, HfSiO, HfSiON, HfTaO, HfTiO, HfZrO, ZrO$_2$, Al$_2$O$_3$, or combinations thereof, but the present disclosure is not limited thereto.

A gate capping layer 247 may be disposed on the gate electrode 245. The gate capping layer 247 may cover an upper surface of the gate electrode 245 and may extend along the second direction. For example, the gate capping layer 247 may include a silicon nitride or a silicon oxynitride. A gate spacer 241 may be disposed on both sidewalls of the gate electrode 245 and both sidewalls of the gate capping layer 247. The gate spacer 241 may extend in a direction, in which the gate electrode 245 extends, on both sidewalls of the gate electrode 245. A gate insulating layer 242 may be interposed between the gate electrode 245 and the gate spacer 241. For example, the gate spacer 241 may include silicon oxide ($SiO_x$), silicon nitride ($SiN_x$), silicon oxynitride ($SiO_xN_y$), silicon carbonitride ($SiC_xN_y$), silicon oxycarbide nitride ($SiO_xC_yN_z$), or combinations thereof. In an embodiment, the gate spacer 241 may include a plurality of layers including different materials.

The variable-resistance memory device 200 according to this embodiment may include source/drain regions 210 disposed in certain regions of the active fins 205 disposed on opposite sides of the gate structure GS.

The source/drain region 210 may include forming a recess R in a certain region of the active fin 205 and performing a selective epitaxial growth (SEG) process on the recess R. The source/drain regions 210 may include Si, SiGe, or Ge, and the source/drain regions 210 may have a different material or a different shape depending on an N-type or P-type transistor. For example, in the case of a PMOS transistor, the source/drain regions 210 may include silicon-germanium (SiGe) and may be doped with P-type impurities (for example, boron (B), indium (In), gallium (Ga), or the like). A cross section (a D2-D3 cross-section, see FIG. 8C) of the source/drain regions 210 may have a pentagonal shape. In the case of an NMOS transistor, the source/drain regions 210 include silicon and may be doped with N-type impurities (for example, phosphorus (P), nitrogen (N), arsenic (As), antimony (Sb), or the like). A cross section (a D3-D3 cross section) of the source/drain regions 210 may have a hexagonal shape or a polygonal shape having a shallow angle. As described above, the source/drain regions 210 may constitute a 3D semiconductor device, such as a Fin-FET, together with the active fin 205 and the gate structure GS.

The variable-resistance memory device 200 according to this embodiment may include a first contact structure 210A, penetrating through an interlayer insulating portion 260 to be connected to the source/drain region 210, and a second contact structure 210B penetrating through the interlayer insulating portion 260 to be connected to the gate electrode 245 of the gate structure GS. The interlayer insulating portion 260 may include an inter-gate insulating layer 261 and a capping insulating layer 262 disposed on the inter-gate insulating layer 261. For example, at least one of the inter-gate insulating layer 261 and the capping insulating layer 262 may include TEOS, USG, PSG, BSG, BPSG, FSG, SOG, TOSZ, or combinations thereof. Each of the first and second contact structures 220A and 220B may include a conductive barrier layer 221 and a contact plug 225.

An upper surface of the first contact structure 220A may be disposed on a lower level than an upper surface of the second contact structure 220B. The first contact structure 220A may fill a lower region CH1_b of a first contact hole CH1, and a variable-resistance structure 250 may be disposed in an upper region CH1_a of a first contact hole CH1.

The variable-resistance structure 250 may include a first electrode layer 252 disposed on the first contact structure 220A, a variable-resistance layer 255 disposed on the first electrode layer 252, and a second electrode layer 257 disposed on the variable-resistance layer 255. In the upper region CH1_a of the first contact hole CH1, the first electrode layer 252 may include a first portion 252a, disposed on a contact plug 225, and a second portion 252b extending along a sidewall of the upper region CH1_a of the first contact hole CH1. The sidewall spacer 254 may be disposed between the extending second portion 252a of the first electrode layer 252 and the variable-resistance layer 255.

The sidewall spacer 254 may extend along a portion of the interlayer insulating layer 260 surrounding the upper region CH1_a of the first contact hole CH1 between the second portion 252b of the first electrode layer 252 and the variable-resistance layer 255. An upper end of the sidewall spacer 254 may be disposed to be lower than an upper surface of the interlayer insulating layer 260. The conductive barrier layer 221 may have a portion disposed between the interlayer insulating layer 260 and the second portion 252b of the first electrode layer 252. The second electrode layer 257 may have an upper surface, substantially coplanar with the upper surface of the interlayer insulating layer 260. An upper end of the variable-resistance layer 255 may have an upper surface, substantially coplanar with the upper surface of the interlayer insulating layer 260.

A metal silicide layer SC may be formed on the source/drain regions 210 of the first contact structure 220A and the second contact structure 220B. For example, the metal silicide layer SC may be a silicide layer containing Ti, W, Ru, Nb, Mo, Hf, Ni, Co, Pt, Yb, Tb, Dy, Er, Pd, or combinations thereof. In an embodiment, the metal silicide layer SC may include CoSi, NiSi, or TiSi.

In addition, the variable-resistance memory device 200 may include interconnection lines M1 and M2, connected to the first and second contact structures 220A and 220B, on the first and second contact structures 220A and 220B. The interconnection lines M1 and M2 may include a portion of an interconnection such as a back end of line (BEOL). A first dielectric layer 272 and a second dielectric layer 273 may be disposed on the interlayer insulating portion 260. An etch-stop layer 271 may be disposed between the interlayer insulating portion 260 (in particular, the capping insulating layer 262) and the first dielectric layer 272. For example, the etch-stop layer 271 may include a silicon nitride, a silicon carbonitride, an aluminum nitride, or an aluminum oxide. For example, each of the first and second dielectric layers 272 and 273 may include a silicon oxide, a silicon nitride, or a silicon oxynitride.

The interconnection lines M1 and M2 according to this embodiment may include metal lines ML, each extending in the first direction, and contact vias VM disposed between the first and second contact structures 240A and 240B and the metal lines ML. These interconnection lines M1 and M2 may be formed by a dual damascene process. The first contact structure 220A and the second contact structure 220B may be connected to the source/drain regions 210, respectively. The first and second contact structures 220A and 220B may be connected to first interconnection lines M1. In addition, the second interconnection line M2 may be connected to the gate structure GS by a third contact structure, not illustrated.

Even in this embodiment, the sidewall spacer 254 may be introduced between the second portion 252b of the first electrode layer 252 and the variable-resistance layer 255 to generate no parasitic component and to secure switching uniformity in a plurality of memory cells. Due to such an inhibition of a parasitic component as well as a limitation of a contact region between the first electrode layer 252 and the variable-resistance layer 254 to the first portion 252a, energy efficiency of a memory cell may be improved.

As described above, a sidewall spacer may be introduced between an extending portion of a lower electrode and a variable-resistance layer (for example, a TMO) to improve uniformity of a plurality of resistive random-access memory (ReRAM) cells (or a variable-resistance structure) without generating a parasitic filament component.

While embodiments have been shown and described above, it will be apparent to those skilled in the art that modifications and variations could be made without departing from the scope of the present inventive concept as defined by the appended claims.

What is claimed is:

1. A variable-resistance memory device comprising:
a substrate having an active region;
a gate structure disposed in the active region;
a drain region disposed on a first side adjacent to the gate structure;
a source region disposed on a second side adjacent to the gate structure;
an interlayer insulating layer covering the active region and having a first contact hole and a second contact hole respectively connected to the drain region and the source region;
a first contact structure filling a lower region of the first contact hole;
a second contact structure filling the second contact hole;
a first electrode layer having a first portion disposed on the first contact structure and having a second portion extending to a sidewall of an upper region of the first contact hole;
a variable-resistance layer disposed on the first electrode layer in the upper region of the first contact hole;
a sidewall spacer disposed between the second portion of the first electrode layer and the variable-resistance layer in the upper region of the first contact hole; and
a second electrode layer disposed on the variable-resistance layer in the upper region of the first contact hole.

2. The variable-resistance memory device of claim 1, further comprising:
a first interconnection line and a second interconnection line disposed on the interlayer insulating layer, and respectively connected to the second electrode layer and the second contact structure.

3. The variable-resistance memory device of claim 1, wherein the sidewall spacer extends on a portion of the interlayer insulating layer surrounding the upper region of the first contact hole.

4. The variable-resistance memory device of claim 3, wherein the sidewall spacer has an upper end disposed to be lower than an upper surface of the interlayer insulating layer.

5. The variable-resistance memory device of claim 4, wherein the variable-resistance layer extends to the portion of the interlayer insulating layer along the sidewall spacer.

6. The variable-resistance memory device of claim 1, wherein a region adjacent to an upper end of the sidewall spacer has a width smaller than a width of another region of the sidewall spacer.

7. The variable-resistance memory device of claim 1, wherein the second electrode layer has an upper surface substantially coplanar with an upper surface of the interlayer insulating layer.

8. The variable-resistance memory device of claim 7, wherein an upper end of the variable-resistance layer has a surface substantially coplanar with the upper surface of the interlayer insulating layer.

9. The variable-resistance memory device of claim 1, further comprising:
an oxygen reservoir layer disposed between the variable-resistance layer and the second electrode layer.

10. The variable-resistance memory device of claim 9, wherein:

the variable-resistance layer includes a compound of metal and oxygen,
the oxygen reservoir layer includes an oxide of the same metal as the metal of the variable-resistance layer, and has an oxygen concentration lower than an oxygen concentration of the variable-resistance layer.

11. The variable-resistance memory device of claim 1, wherein the first contact structure has an upper surface disposed on a level lower than a level of an upper surface of the second contact structure.

12. The variable-resistance memory device of claim 1, wherein each of the first and the second contact structures includes a conductive barrier layer and a contact plug.

13. The variable-resistance memory device of claim 12, wherein the conductive barrier layer of the first contact structure has an upper end disposed to be higher than an upper surface of the first contact structure.

14. The variable-resistance memory device of claim 13, wherein the conductive barrier layer has a portion disposed between the interlayer insulating layer and the second portion of the first electrode layer.

15. The variable-resistance memory device of claim 13, wherein the upper end of the conductive barrier layer has substantially the same height as an upper end of the second portion of the first electrode layer.

16. A variable-resistance memory device comprising:
a substrate;
an insulating layer disposed on the substrate and having a contact hole;
a contact structure filling a lower region of the contact hole;
a first electrode layer having a first portion disposed on the contact structure and a second portion extending to a side wall of an upper region of the contact hole;
a variable-resistance layer covering the first electrode layer in the upper region of the contact hole;
a sidewall spacer disposed between the second portion of the first electrode layer and the variable-resistance layer in the upper region of the contact hole; and
a second electrode layer disposed on the variable-resistance layer in the upper region of the first contact hole.

17. The variable-resistance memory device of claim 16, wherein the sidewall spacer extends onto a portion surrounding the upper region of the contact hole and has an upper end disposed to be lower than an upper surface of the insulating layer.

18. The variable-resistance memory device of claim 16, wherein the second electrode layer and the variable-resistance layer have surfaces substantially coplanar with an upper surface of the insulating layer.

19. The variable-resistance memory device of claim 16, wherein:
the contact structure includes a conductive barrier layer and a contact plug, and
the conductive barrier layer has an upper end disposed to be higher than an upper surface of the contact structure.

20. A variable-resistance memory device comprising:
a substrate having an active region;
a gate structure disposed in the active region and extending in one direction;
source/drain regions disposed in the active region on opposite sides of the gate structure;
an interlayer insulating layer covering the active region and having a first contact hole and a second contact hole respectively connected to the source/drain regions;
a first contact structure filling a lower region of the first contact hole;

a second contact structure filling the second contact hole; and a variable-resistance structure filling the upper region of the first contact hole and having an upper surface substantially coplanar with an upper surface of the interlayer insulating layer, wherein the variable-resistance structure includes a first electrode layer disposed on the first contact structure and having an extension portion extending to a sidewall of the upper region of the first contact hole, a variable-resistance layer disposed on the first electrode layer, a sidewall spacer disposed between the extension portion of the first electrode layer and the variable-resistance layer, and a second electrode layer disposed on the variable-resistance layer, and wherein the second electrode layer and the variable-resistance layer are exposed to the upper surface of the variable-resistance structure.

\* \* \* \* \*